United States Patent
Nishida et al.

(10) Patent No.: US 7,912,103 B2
(45) Date of Patent: *Mar. 22, 2011

(54) SEMICONDUCTOR LASER DRIVING CIRCUIT, LIGHT EMITTING DEVICE, AND DISK DRIVE

(75) Inventors: Toshio Nishida, Kyoto (JP); Sho Maruyama, Kanagawa (JP)

(73) Assignee: Rohm Co., Ltd., Kyoto (JP)

( * ) Notice: Subject to any disclaimer, the term of this patent is extended or adjusted under 35 U.S.C. 154(b) by 291 days.

This patent is subject to a terminal disclaimer.

(21) Appl. No.: 12/107,800

(22) Filed: Apr. 23, 2008

(65) Prior Publication Data
US 2009/0323745 A1    Dec. 31, 2009

Related U.S. Application Data

(63) Continuation of application No. 11/560,977, filed on Nov. 17, 2006, now Pat. No. 7,372,884.

(30) Foreign Application Priority Data

Nov. 18, 2005    (JP) .................................. 2005-334656

(51) Int. Cl.
*H01S 3/13*    (2006.01)
*H01S 3/04*    (2006.01)
*H01S 3/00*    (2006.01)

(52) U.S. Cl. .................... 372/38.07; 372/29.015; 372/34
(58) Field of Classification Search ............. 372/29.011, 372/29.015, 34, 38.01, 38.07
See application file for complete search history.

(56) References Cited

OTHER PUBLICATIONS

Nishida et al.; "Semiconductor Laser Driving Circuit, Light Emitting Device, and Disk Drive"; U.S. Appl. No. 11/560,977, filed Nov. 17, 2006.

*Primary Examiner* — Armando Rodriguez
(74) *Attorney, Agent, or Firm* — Keating & Bennett, LLP

(57) ABSTRACT

A semiconductor laser driving circuit has a circuit protection function at low temperature and includes a voltage current converter that converts an input voltage Vin, which is determined according to a desired light brightness of the semiconductor laser to be driven, into a current. A current limiter limits an output current of the voltage current converter to a specified current value or less. An output amplifier amplifies the output current of the voltage current converter and supplies the amplified current as a drive current to the semiconductor laser. A temperature detection circuit detects a low temperature state and, in the low temperature state, decreases the specified current value of the current limiter.

12 Claims, 8 Drawing Sheets

200

SEMICONDUCTOR LASER DRIVING CIRCUIT, LIGHT EMITTING DEVICE, AND DISK DRIVE

BACKGROUND OF THE INVENTION

1. Field of the Invention

The present invention relates to a semiconductor laser driving technique and, more particularly, to a driving technique in a low temperature range of a nitride semiconductor laser.

2. Description of Related Art

In recent years, a wideband gap semiconductor laser diode made of a material such as gallium nitride (GaN), which is the material for a blue laser is being used more and more. Such a nitride semiconductor laser characterized by a short wavelength is widely applied to a pickup device for writing/reading data to/from a next-generation DVD (Digital Versatile Disc), a display, a printer, medical equipment, and the like.

Generally, the brightness of a semiconductor laser is determined according to the amount of current flowing in the device. Therefore, to make a semiconductor laser emit light with a desired brightness, it is necessary to perform constant current driving by supplying a current from a driving circuit and according to the desired brightness (refer to Japanese Patent Laid-Open No. H5-259544 and Japanese Utility Model Laid-Open No. S63-29968).

Although the properties of an arsenic (As)-based or phosphorus (P)-based semiconductor laser emitting red light or near infrared light improve as the temperature decreases, the nitride semiconductor laser has a problem in that its properties deteriorate as the temperature decreases. This problem is caused by a large band gap and a deep impurity level used for doping of the nitride semiconductor. Specifically, since the impurity level is deep, the activation rate of carries (holes in the case of a nitride semiconductor) is low even at room temperature. When the temperature further decreases, the carrier concentration becomes lower. Generally, the electric conductivity of a semiconductor is determined by the product of the carrier mobility and carrier concentration. When the carrier concentration decreases at the time of low temperature, device resistance increases. Further, in a junction region in a diode, the carriers on the side where the decrease in the carrier concentration is larger (a P-type region in the nitride semiconductor laser) tend to deplete, so that carriers of the opposite polarity (electrons in the nitride semiconductor laser) move over the junction region to the side where the carrier concentration is low (a P-type region in the nitride semiconductor laser). The carriers injected to the opposite polarity region where resistance became higher cause energy obtained from an electric field generated due to the high resistance release in the form of a point defect, and it causes problems such as failure in the device and deterioration in reliability such as device life span.

Generally, the brightness of a semiconductor laser is controlled by current injection control using the driving circuit as described above. Consequently, when a current which is the same as that at room temperature is supplied to a semiconductor laser in which a resistance value increases at a low temperature, a voltage applied to the device becomes high at the low temperature. In some cases, this negative influence is exerted on the device characteristics, the life span, and the like.

It is expected that driving of a semiconductor laser, particularly in consumer products, is started in a low-temperature environment. Considering that next-generation DVDs on which nitride semiconductor lasers are mounted and the like are being widely sold and used in the future, it is necessary to enhance circuit protection of a semiconductor laser.

SUMMARY OF THE INVENTION

In order to overcome the problems described above, preferred embodiments of the present invention provide a semiconductor laser driving circuit having the function of circuit protection at low temperature.

According to a preferred embodiment of the present invention, a driving circuit for driving a semiconductor laser includes a voltage current converter arranged to convert an input voltage, which is determined according to a desired light brightness of the semiconductor laser to be driven, into a current, a current limiter arranged to limit an output current of the voltage current converter to a specified current value or less, an output amplifier arranged to amplify the output current of the voltage current converter and to supply the amplified current as a drive current to the semiconductor laser, and a temperature detection circuit arranged to detect a low temperature state and to decrease the specified current value of the current limiter in the low temperature state.

Since the resistance value of a wideband gap semiconductor laser such as a nitride semiconductor laser increases as the temperature decreases, when the same current is passed at the room temperature and at the low temperature, the voltage applied to the device at the low temperature becomes high. In this mode, consequently, by limiting the current flowing in the semiconductor laser to a predetermined current at low temperature, application of a high voltage to the semiconductor laser can be prevented, and suitable circuit protection can be performed. The "low temperature state" denotes a state of a temperature at which the characteristics of the semiconductor laser deteriorate and varies among devices. Although a clear temperature range is not specified, the low temperature may be, for example, 10° C. or less, or 0° C. or less.

The temperature detection circuit may determine the low temperature state on the basis of an operation voltage of the semiconductor laser to be driven. Further, the temperature detection circuit preferably includes a comparator arranged to compare an operation voltage of the semiconductor laser to be driven with a predetermined threshold voltage and, when the operation voltage exceeds the threshold voltage, determines a low temperature state.

In the case of driving the semiconductor laser with a constant current, the operation voltage, that is, the anode-to-cathode voltage, increases as the temperature decreases. Therefore, by monitoring the operation voltage of the semiconductor laser, it can be determined that the semiconductor laser is in the low temperature state.

The temperature detection circuit may decrease the specified current value of the current limiter as the operation voltage of the semiconductor laser to be driven increases.

By decreasing the upper limit of the current flowing in the semiconductor laser as the operation voltage of the semiconductor laser increases, that is, as the temperature of the device decreases, more suitable circuit protection can be performed.

The temperature detection circuit may include an inverting amplifier arranged to amplify the difference between the operation voltage of the semiconductor laser to be driven and a predetermined reference voltage and, on the basis of an output voltage of the inverting amplifier, may decrease the specified current value of the current limiter.

In this case, the output voltage of the inverting amplifier rises as the temperature decreases. Consequently, as the temperature decreases, the upper limit value of the drive current can be lowered.

The temperature detection circuit may include a transistor having one end at which a potential is fixed and the other end to which a constant current load is connected, and a bias circuit for applying a constant voltage to the gate of the transistor. The temperature detection circuit may determine a low temperature state in accordance with an on/off state of the transistor.

A gate-source threshold voltage Vt of a MOSFET (Metal Oxide Semiconductor Field Effect Transistor) rises as the temperature decreases. By applying a constant voltage according to the threshold temperature for determining the low temperature state to the gate, the MOSFET turns off at a low temperature and turns on at a high temperature, so that a low temperature state can be determined.

The temperature detection circuit may include a temperature sensor arranged to monitor the temperature of the semiconductor laser to be driven. By using the temperature sensor, the temperature of the semiconductor laser can be directly measured.

The voltage current converter may preferably include a first resistor having a first end at which a potential is fixed, a first transistor having a first end connected to a second end of the first resistor, a second resistor having a first end at which a potential is fixed, a second transistor having a first end connected to a second end of the second resistor, and a first operational amplifier having a non-inversion input terminal to which a voltage according to the input voltage is applied and which is connected to a connection point of the first resistor and the first transistor, and having an output terminal connected to control terminals of the first and second transistors, and may output current flowing to the second transistor. The current limiter may preferably include a third resistor having a first end at which a potential is fixed, a third transistor having a first end is connected to a second end of the third resistor, and a second operational amplifier having a non-inversion input terminal to which a voltage according to the specified current value is applied and which is connected to a connection point of the third resistor and the third transistor, and having an output terminal connected to control terminals of the first, second, and third transistors.

In this case, when a voltage according to the input voltage, which is input to the non-inversion input terminal of the first operational amplifier is lower than a voltage according to the specified current value, which is input to the non-inversion input terminal of the second operational amplifier, a current proportional to the voltage according to the input voltage is output. When the voltage according to the input voltage exceeds the voltage according to the specified current value, the output current is limited to the specified current value.

The driving circuit may be integrated on a single semiconductor substrate. The "integrating" includes the case where all of components of the circuit are formed on a semiconductor substrate and the case where main components of the circuit are integrated. A portion of resistors, capacitors, and the like may be provided on the outside of the semiconductor substrate for adjusting a circuit constant. By integrating the driving circuit as one LSI, the circuit area can be reduced, and the characteristics of the circuit device can be maintained uniformly.

Another preferred embodiment of the present invention relates to a light emitting device. The light emitting device preferably includes a semiconductor laser, and the above-described driving circuit for driving the semiconductor laser. The semiconductor laser may be a nitride semiconductor laser made of GaN or other suitable material.

Further another preferred embodiment of the present invention relates to a disk drive. The disk drive includes the above-described light emitting device for irradiating a disk medium with light output from the semiconductor laser.

An arbitrary combination of the components and replacement of the components and expressions of various preferred embodiments of the present invention described above among the methods, devices, systems, and the like are also effective as embodiments of the present invention.

With the driving circuit according to various preferred embodiments of the present invention, the device can be protected excellently at a low temperature.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

First Preferred Embodiment

Figure 1:
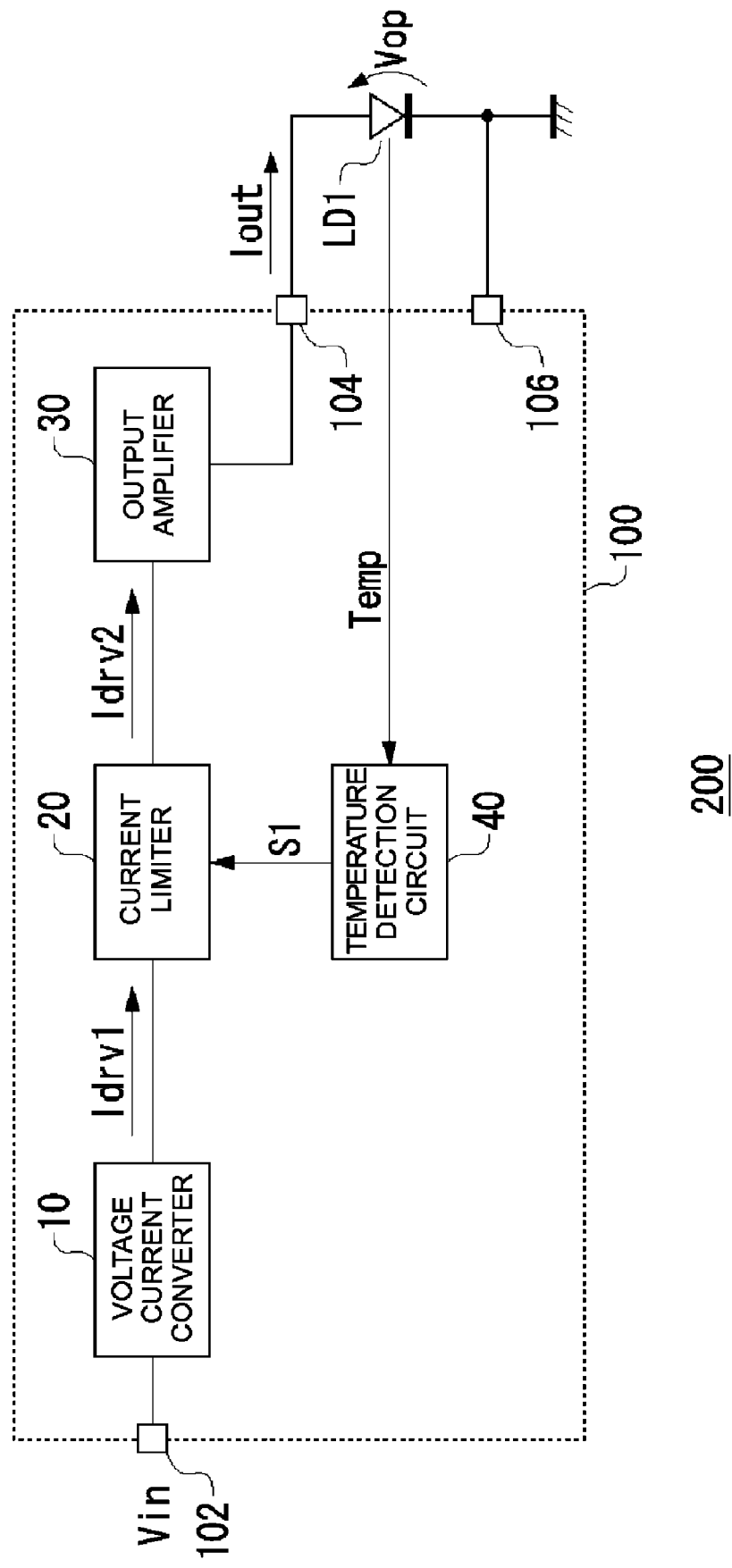
FIG. 1 is a circuit diagram showing the configuration of a light emitting device according to a first preferred embodiment of the present invention.

FIG. 1 is a circuit diagram showing the configuration of a light emitting device 200 according to a first preferred embodiment of the present invention. The light emitting device 200 preferably includes a semiconductor laser LD1 and a driving circuit 100 for driving the semiconductor LD1. In the present preferred embodiment, the driving circuit 100 is preferably integrally formed as a functional IC on a single semiconductor substrate. The driving circuit 100 generates an output current Iout according to an input voltage Vin, which is determined according to a desired light brightness of the semiconductor laser LD1 to be driven, and supplies the output current Iout to the semiconductor laser LD1. The driving circuit 100 has, as input/output terminals, an input terminal 102, an output terminal 104, and a ground terminal 106. The input voltage Vin is supplied from the outside to the input terminal 102. The output terminal 104 is connected to the anode of the semiconductor laser LD1 to be driven, and the ground terminal 106 is grounded together with the cathode of the semiconductor laser LD1. In the present preferred embodiment, current flowing in the semiconductor laser LD1 is called the output current Iout (or drive current), and an anode-to-cathode voltage in the semiconductor laser LD1 is called an operation voltage Vop. In the present preferred embodiment, the semiconductor laser LD1 is preferably a nitride semiconductor laser made of GaN or other suitable material.

A voltage-current converter 10 converts the input voltage Vin, which is determined according to a desired light brightness of the semiconductor laser LD1 to be driven, into a current Idrv1. A current limiter 20 limits the output current Idrv1 of the voltage-current converter 10 to a specified current value Ilim or less. An output amplifier 30 amplifies an output current Idrv2 of the voltage-current converter 10 limited by the current limiter 20 and supplies the resultant current as a drive current Iout to the semiconductor laser LD1.

A temperature detection circuit 40 monitors a temperature Temp of the semiconductor laser LD1 and detects a low temperature state of the semiconductor laser LD1. The temperature detection circuit 40 outputs a control signal S1 to the current limiter 20. When the temperature detection circuit 40 detects the low temperature state, the temperature detection circuit 40 causes the specified current value Ilim of the current limiter 20 to decrease.

Figure 2:
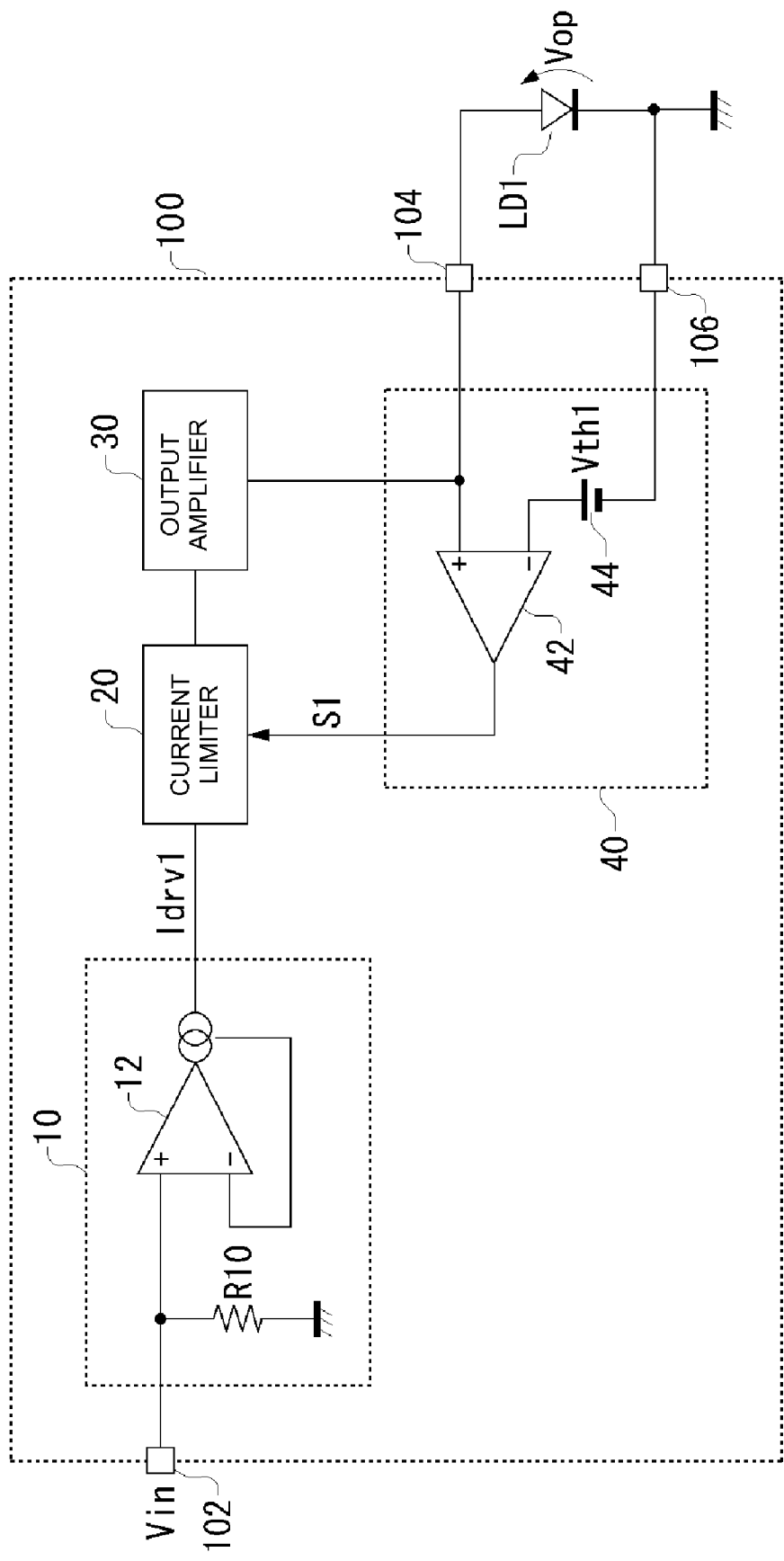
FIG. 2 is a circuit diagram showing an example of a detailed configuration of a driving circuit in FIG. 1.

FIG. 2 is a circuit diagram showing an example of a detailed configuration of the driving circuit 100 in FIG. 1 according to the present preferred embodiment. The voltage-current converter 10 preferably includes a resistor R10 and a conductance amplifier 12. One end of the resistor R10 is grounded and the other end of the resistor R10 is connected to the input terminal 102. A non-inversion input terminal of the conductance amplifier 12 is connected to the input terminal 102. The input voltage Vin is applied to the non-inversion input terminal of the conductance amplifier 12. The conductance amplifier 12 converts the input voltage Vin to the current Idrv1 and outputs the current Idrv1.

In the present preferred embodiment, the temperature detection circuit 40 preferably includes a comparator 42 and a reference voltage source 44, and determines a low temperature state on the basis of the operation voltage Vop of the semiconductor laser LD1 to be driven. The non-inversion input terminal of the comparator 42 is connected to the output terminal 104, and the operation voltage Vop is supplied to the comparator 42. A threshold voltage Vth1 generated by the reference voltage source 44 is supplied to the non-inversion input terminal of the comparator 42. The comparator 42 compares the operation voltage Vop of the semiconductor laser LD1 with the threshold voltage Vth1 and outputs the control signal S1 which becomes the high level when Vop>Vth1 and becomes the low level when Vop<Vth1. When the operation voltage Vop exceeds the threshold voltage Vth1, the temperature detection circuit 40 determines the low temperature state.

In the case of driving the semiconductor laser LD1 with a constant current, the lower the temperature is, the higher the operation voltage Vop is. The driving circuit 100 according to the present preferred embodiment determines that the semiconductor laser is in the low temperature state by monitoring the operation voltage Vop of the semiconductor laser LD1.

The current limiter 20 sets the specified current value Ilim to a first current Ilim1 when the control signal S1 becomes the low level, and sets the specified current Ilim to a second current Ilim2 lower than the first current Ilim1 when the control signal S1 becomes the high level.

Figure 3:
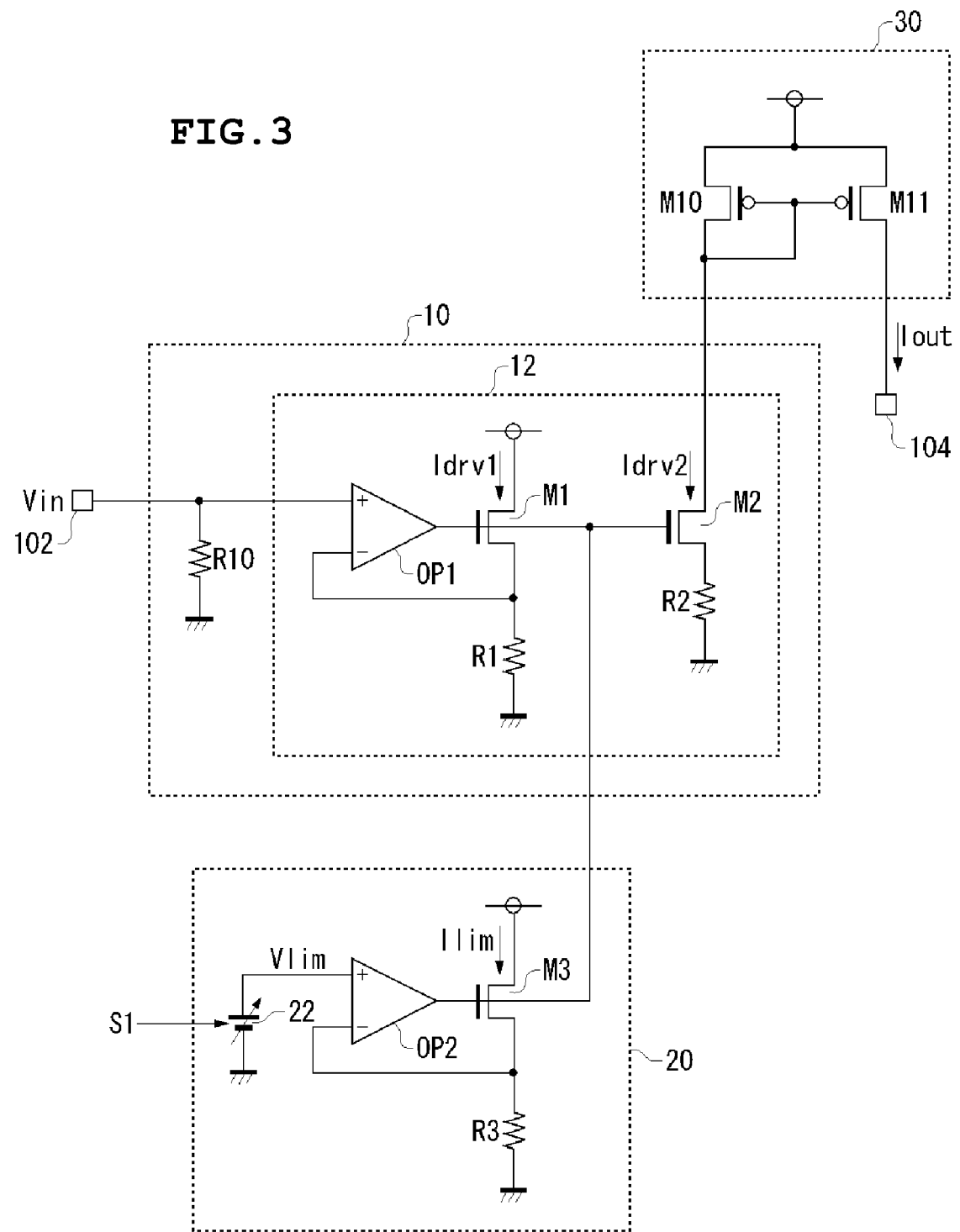
FIG. 3 is a circuit diagram showing an example of the configuration of a voltage current converter, a current limiter, and an output amplifier.

FIG. 3 is a circuit diagram showing an example of the configuration of the voltage current converter 10, the current limiter 20, and the output amplifier 30.

The voltage current converter 10 preferably includes a first resistor R1, a second resistor R2, a first transistor M1, a second transistor M2, a first operational amplifier OP1, and a resistor R10.

One end of the first resistor R1 is grounded and the potential of the first resistor R1 is fixed. The first transistor M1 is preferably an N-channel MOSFET and its source is connected to the other end of the first resistor R1. Similarly, one end of the second resistor R2 is grounded, and the source of the second transistor M2 as an N-channel MOSFET is connected to the other end of the second resistor R2. The input voltage Vin is supplied to the non-inversion input terminal of the first operational amplifier OP1, and the inversion input terminal of the first operational amplifier OP1 is connected to a connection point of the first resistor R1 and the first transistor M1. The output terminal of the first operational amplifier OP1 is connected to the gate as a control terminal of each of the first and second transistors M1 and M2. The voltage current converter 10 outputs the current flowing in the second transistor M2 as the drive current Idrv2.

In the voltage current converter 10, feedback control is performed so that the potential at the non-inversion input terminal of the first operational amplifier OP1 and that at the inversion input terminal become close to each other, so that the potential at the connection point between the first resistor R1 and the first transistor M1 becomes equal to the input voltage Vin. As a result, current given by Idrv1=Vin/R1 flows in the first resistor R1 and the first transistor M1.

In the present preferred embodiment, the first and second resistors R1 and R2 are paired, and the first and second transistors M1 and M2 are also paired. As a result, the gate potential of the first and second transistors M1 and M2 becomes equal to the output voltage of the first operational amplifier OP1, and the current Idrv2 according to the drive current Idrv1 flows in the second transistor M2.

The current limiter 20 preferably includes a third resistor R3, a third transistor M3, a second operational amplifier OP2, and a voltage source 22. One end of the third resistor R3 is grounded, and the potential of the third resistor is fixed. The source of the third transistor M3 is connected to the other end of the third resistor R3. The voltage source 22 generates the specified voltage Vlim according to the specified current Ilim. The voltage source 22 is a variable voltage source. The control signal S1 is input to the voltage source 22. When the control signal S1 is at the low level, the specified voltage Vlim is set to the first voltage Vlim1. When the control signal S1 is at the high level, that is, in the low temperature state, the voltage source 22 sets the specified voltage Vlim to the second voltage Vlim2 lower than the first voltage Vlim1. The specified voltage Vlim output from the voltage source 22 is input to the non-inversion input terminal of the second operational amplifier OP2, and the inversion input terminal is connected to the connection point of the third resistor R3 and the third transistor M3. The output terminal of the second operational amplifier OP2 is connected to the gate as a control terminal of each of the first, second, and third transistors M1, M2, and M3.

When the input voltage Vin becomes higher than the specified voltage Vlim, the current limiter 20 becomes active. When the current limiter 20 becomes active, feedback control is performed so that the potential at the non-inversion input terminal of the second operational amplifier OP2 and that at the inversion input terminal become equal to each other. As a result, the potential at the connection point of the third resistor R3 and the third transistor M3 becomes equal to the specified voltage Vlim, and the current determined by Ilim=Vlim/R3 flows in the third transistor M3 and the third resistor R3.

In the present preferred embodiment, the third and second transistors M3 and M2 are paired, and the third and second resistors R3 and R2 are also paired. As a result, the gate potential of the second and third transistors M2 and M3 becomes equal to the output voltage of the second operational amplifier OP2 when the current limiter 20 is active, and the current Idrv2 according to the current Ilim flows in the second transistor M2 when Vin>Vlim.

By action of the current limiter 20, the current Idrv2 can be limited to the specified current Ilim or less according to the specified voltage Vlim. By changing the specified voltage Vlim, the upper limit value of the output current Iout can be adjusted.

The output amplifier 30 preferably includes transistors M10 and M11 as P-channel MOSFETs. The transistor M10 is provided on the path of the drive current Idrv2. The gates and sources of the transistors M10 and M11 are commonly connected, thereby defining a current mirror circuit. The transistors M10 and M11 amplify the drive current Idrv2 in accordance with the mirror ratio, and output the output current Iout from the output terminal 104. When the mirror ratio is 1:n, the equation of Iout=Idrv2×n is satisfied.

Figure 4:
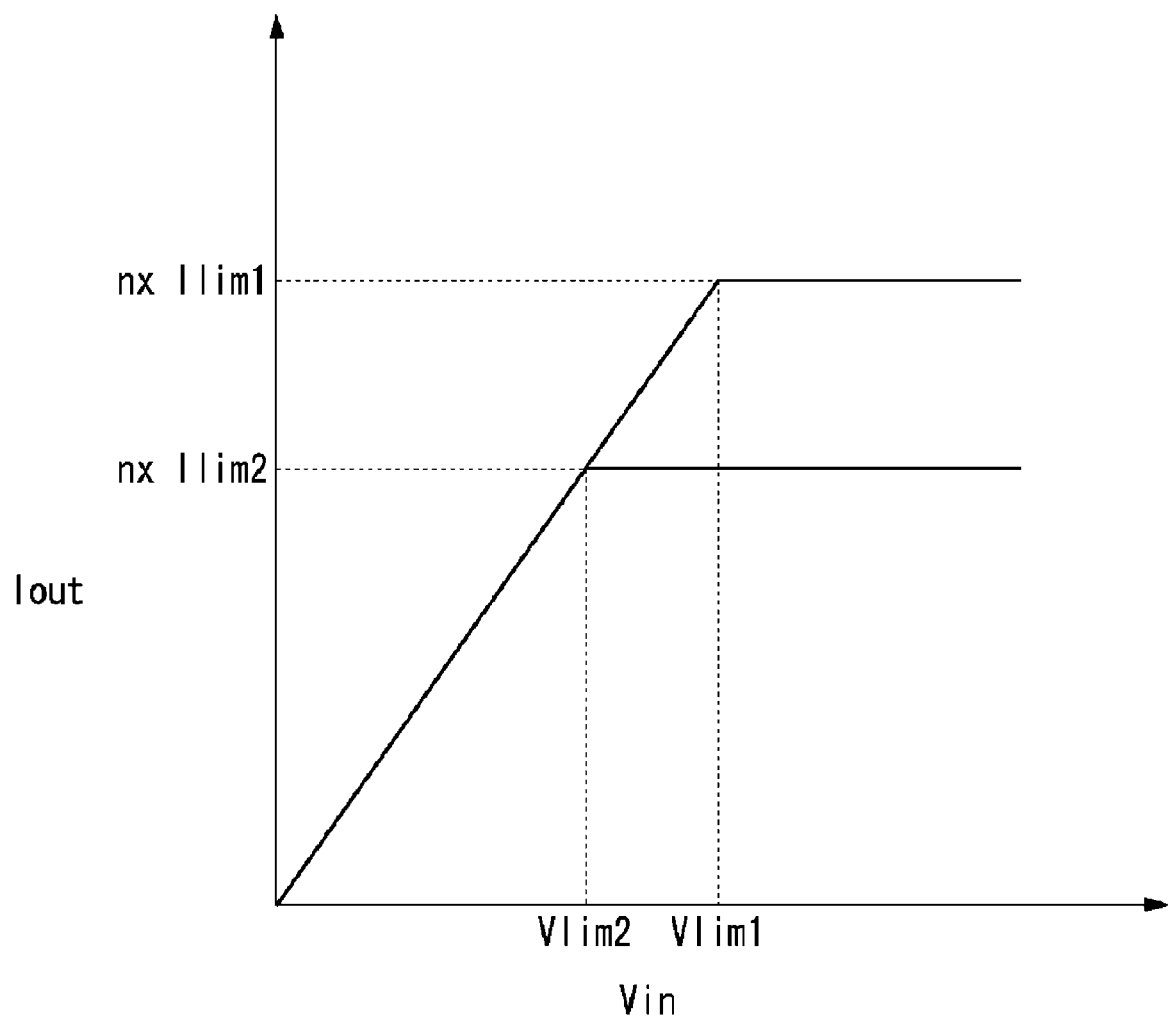
FIG. 4 is a diagram showing input/output characteristics of the driving circuit in FIG. 1.

The operation of the driving circuit 100 with such a configuration will be described. FIG. 4 shows the input/output characteristics of the driving circuit 100 according to the present preferred embodiment. The axis of abscissa of FIG. 4 shows the input voltage Vin and the axis of ordinate indicates the output current Iout. When the control signal S1 output from the temperature detection circuit 40 is at the low level, that is, when the temperature is not low, the specified voltage Vlim of the current limiter 20 is set to Vlim1. The output current Idrv2 of the current limiter 20 increases in proportion to the input voltage Vin in the range of Vin<Vlim1. When the input voltage Vin becomes higher than the specified voltage Vlim1 (Vin>Vlim1), the current limiter 20 becomes active, and the current Idrv2 is limited to Ilim1 or less. As a result, the output current Iout of the driving circuit 100 is limited to n×Ilim1 or less.

When the temperature detection circuit 40 detects the low temperature state, the control signal S1 becomes the high level, and the specified voltage Vlim generated by the voltage source 22 of the current limiter 20 becomes the second voltage Vlim2. As a result, the upper limit value of the output current Iout is limited to n×Ilim2 or less.

Since the resistance value of the wideband gap semiconductor laser such as a nitride semiconductor laser increases as the temperature decreases, when the same current is passed at the room temperature and at the low temperature, the voltage applied to the device at the low temperature becomes high. In the driving circuit 100 according to the present preferred embodiment, by changing the upper limit value of the current flowing in the semiconductor laser LD1 at the low temperature and at the room temperature, application of a high voltage to the semiconductor laser can be prevented, and suitable circuit protection can be performed.

Since the resistance value of the semiconductor laser LD1 increases as the temperature decreases, the operation voltage Vop at the time of performing constant current driving by passing constant current to the semiconductor laser LD1 increases as the temperature decreases. Consequently, the temperature detection circuit 40 of the driving circuit 100 according to the present preferred embodiment can preferably determine the low temperature state by monitoring the operation voltage Vop.

Second Preferred Embodiment

Figure 5:
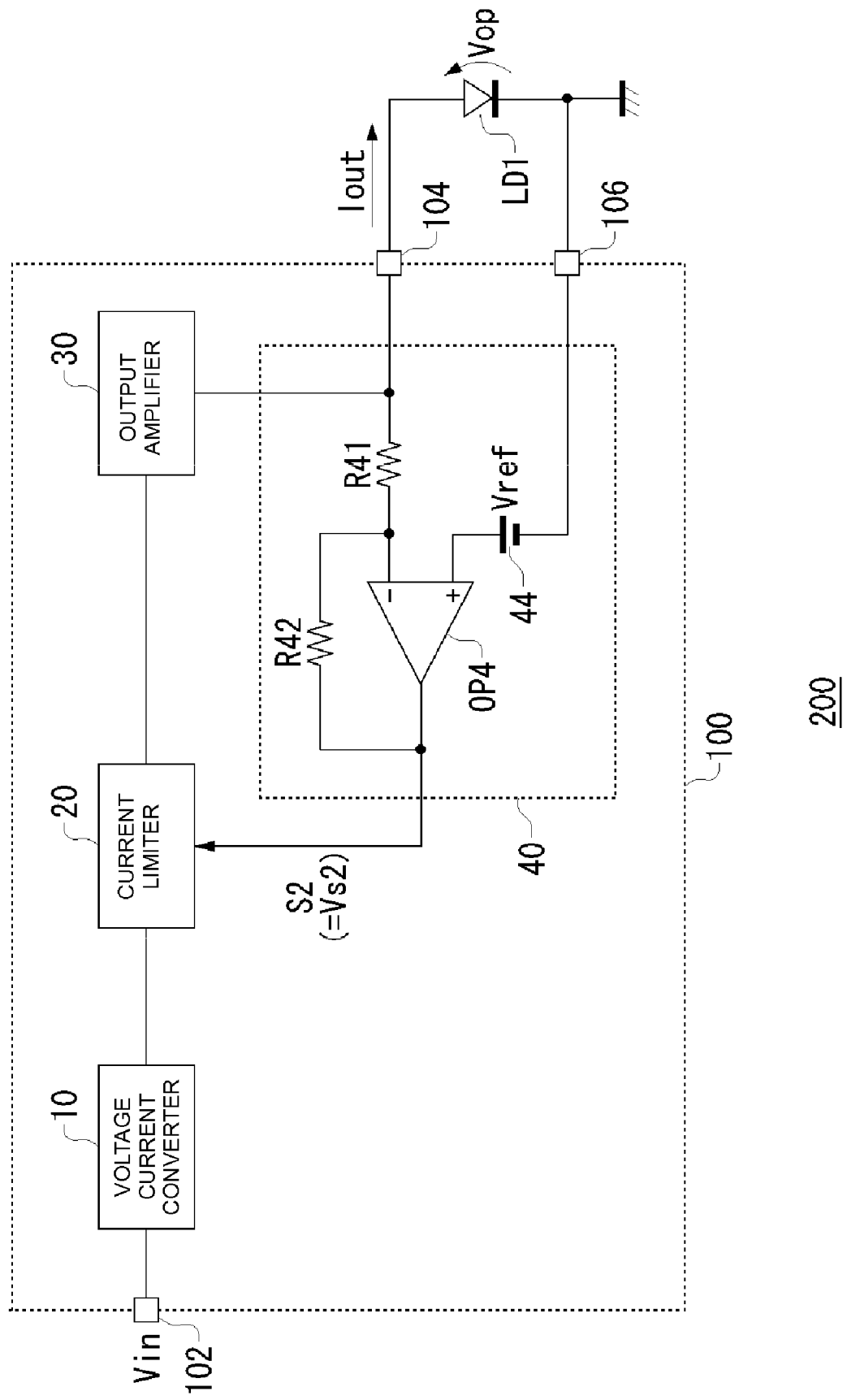
FIG. 5 is a circuit diagram showing the configuration of a driving circuit according to a second preferred embodiment of the present invention.

FIG. 5 is a circuit diagram showing the configuration of the driving circuit 100 according to a second preferred embodiment of the present invention. The driving circuit 100 according to the second preferred embodiment is different from that of the first preferred embodiment with respect to the configuration of the temperature detection circuit 40. The point different from the first preferred embodiment will be mainly described hereinbelow.

In the driving circuit 100 according to the second preferred embodiment, the temperature detection circuit 40 makes the specified current Ilim of the current limiter 20 decrease as the operation voltage Vop of the semiconductor laser LD1 to be driven increases. The temperature detection circuit 40 outputs a control signal S2 for controlling the specified current value Ilim to the current limiter 20.

The temperature detection circuit 40 includes the reference voltage source 44, resistors R41 and R42, and an operational amplifier OP4. A reference voltage Vref generated by the reference voltage source 44 is supplied to the non-inversion input terminal of the operational amplifier OP4. A resistor R41 is provided between the inversion input terminal of the operational amplifier OP4 and the output terminal 104, and a resistor R42 is provided between the output terminal and the inversion input terminal of the operational amplifier OP4. The operational amplifier OP4 and the resistors R41 and R42 construct an inverting amplifier.

The inverting amplifier including the operational amplifier OP4 and the resistors R41 and R42 amplifies the difference between the operation voltage Vop of the semiconductor laser LD1 to be driven and the predetermined reference voltage Vref. An output voltage Vs2 of the inverting amplifier is output as the control signal S2 to the current limiter 20.

In the present preferred embodiment, the current limiter 20 sets a specified voltage Vlim in accordance with the output voltage Vs2 of the inverting amplifier. For example, the output voltage Vs2 of the operational amplifier OP4 may be input to the non-inversion input terminal of the second operational amplifier OP2 of the current limiter 20 in FIG. 3 directly. Alternately, the output voltage Vs2 is multiplied by a constant, and the resultant voltage may be input to the non-inversion input terminal.

Figure 6:
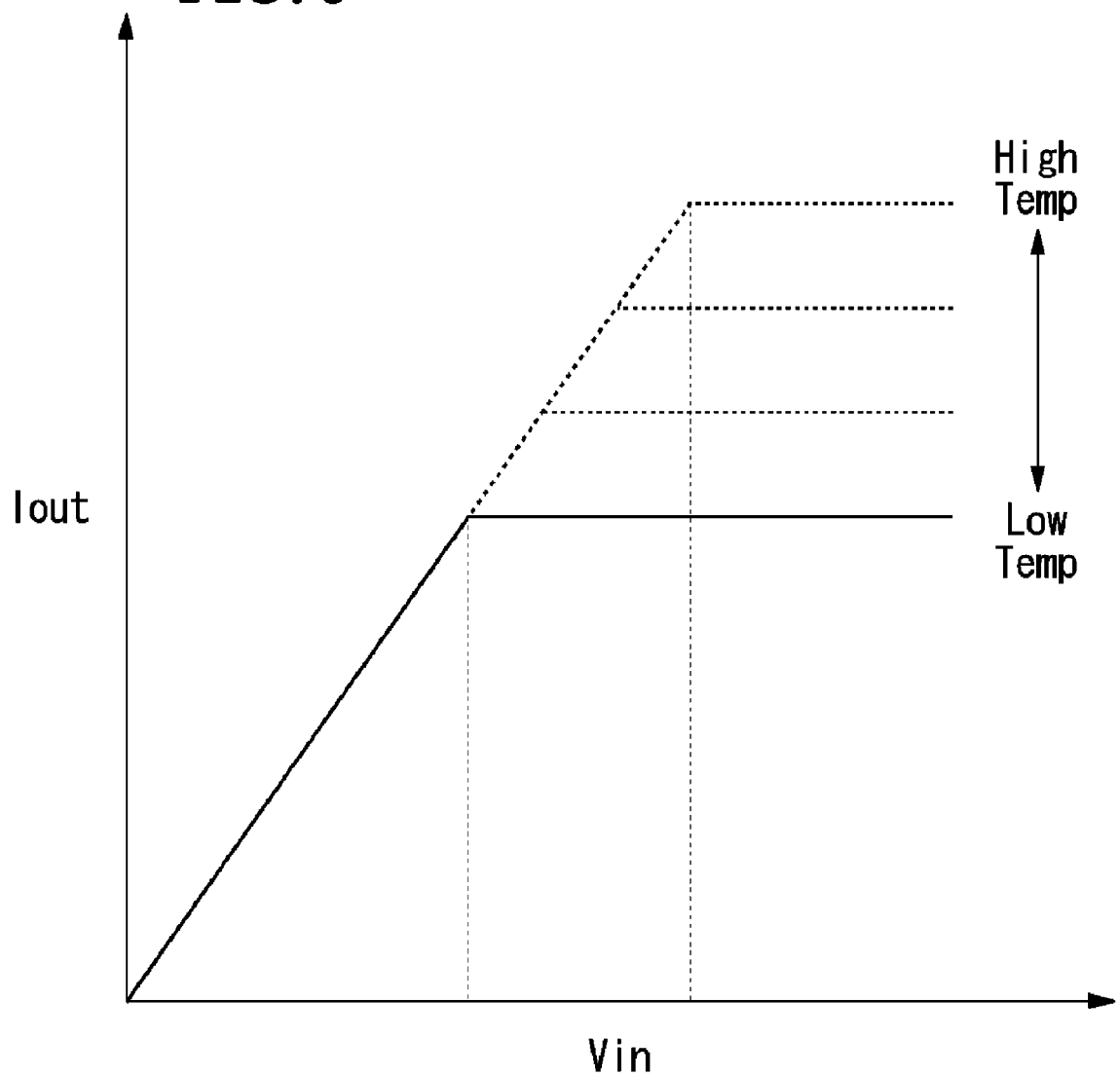
FIG. 6 is a diagram showing input/output characteristics of the driving circuit of FIG. 5.

FIG. 6 shows input/output characteristics of the driving circuit 100 according to the second preferred embodiment. In the present preferred embodiment, the specified voltage Vlim that sets the specified current Ilim of the current limiter 20 continuously changes in accordance with the operation voltage Vop. Specifically, when the temperature decreases at the time of driving the semiconductor laser LD1 with constant current, the operation voltage Vop increases, and the output voltage Vs2 of the temperature detection circuit 40 decreases. As a result, as the temperature decreases, the specified voltage Vlim and the specified current Ilim decrease.

In the driving circuit 100 according to the second preferred embodiment, as the operation voltage Vop of the semiconductor laser LD1 increases, that is, as the temperature of the device decreases, the upper limit value of the current flowing in the semiconductor laser LD1 can be decreased. Thus, preferable circuit protection can be achieved.

Figure 7:
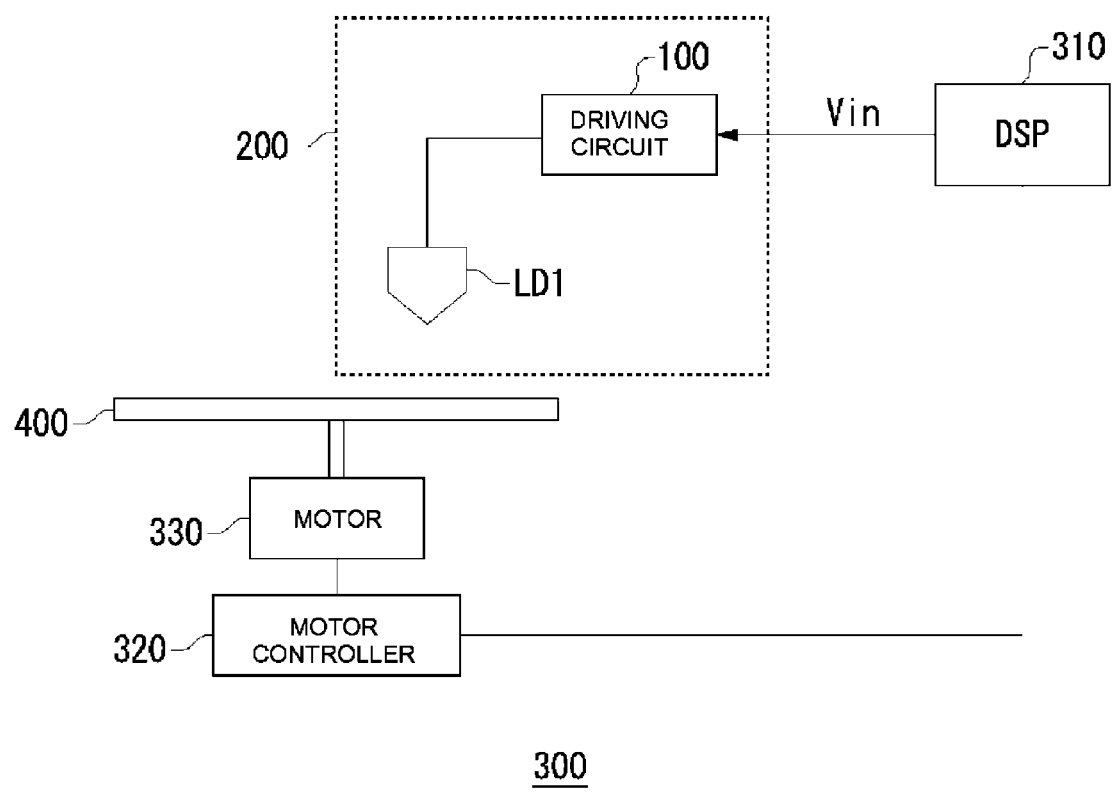
FIG. 7 is a block diagram showing the configuration of a disk drive using the driving circuit according to a preferred embodiment of the present invention.

Finally, an application example in which the light emitting device 200 according to the first and second preferred embodiments can be preferably used will be described. FIG. 7 is a block diagram showing the configuration of a disk drive 300 using the driving circuit 100 according to the present preferred embodiment. The disk drive 300 preferably includes a spindle motor 330 for rotating a disk medium 400, a motor controller 320 for driving the spindle motor 330, the light emitting device 200 according to a preferred embodiment of the present invention, a DSP 310, and a not-shown pickup. The DSP 310 is a block for controlling the disk drive 300 in a centralized manner, controls the emitting state of the light emitting device 200 and also controls rotation of the spindle motor 330. The DSP 310 outputs the input voltage Vin to the light emitting device 200. The light emitting device 200 causes the semiconductor laser LD1 emit light in accordance with the input voltage Vin, and irradiates the disk medium 400 with light output from the semiconductor laser LD1 to execute reading/writing data.

It is understood by a person skilled in the art that the preferred embodiments are illustrative, the components and processes of the preferred embodiments can be variously modified, and the modifications are within the range of the present invention.

Figure 8:
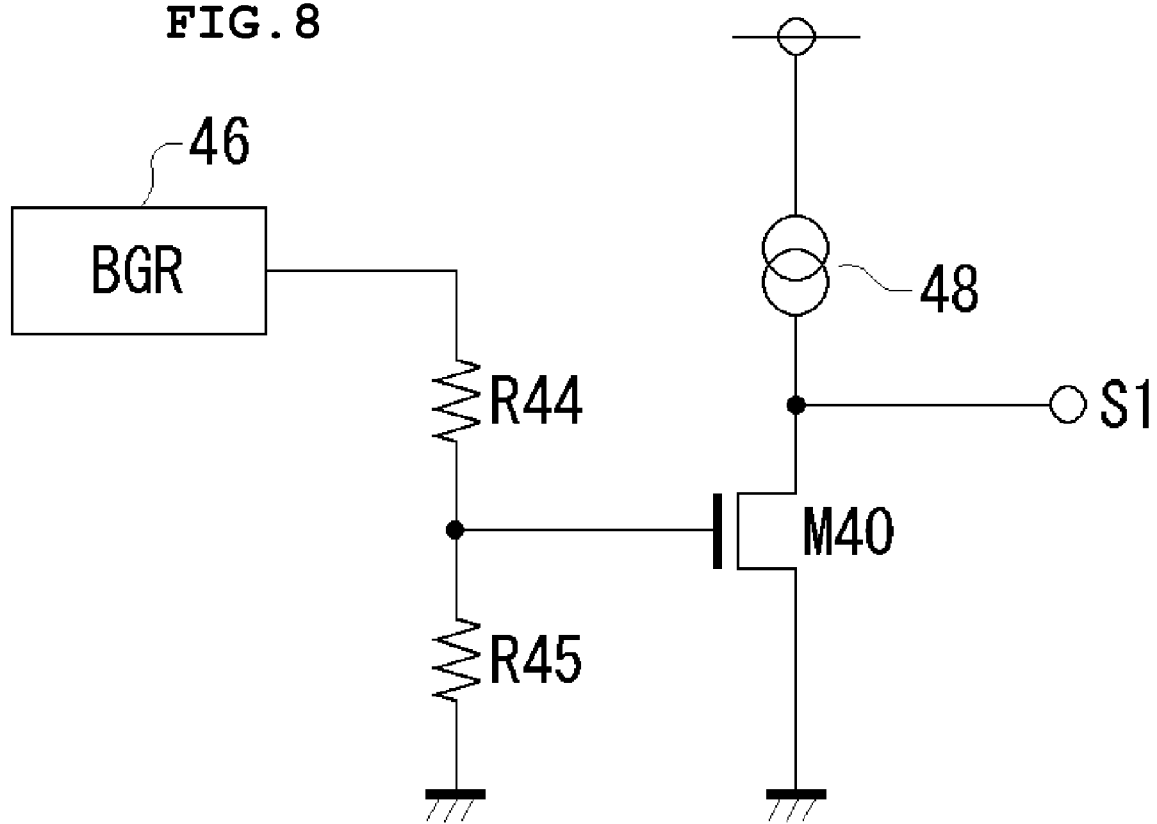
FIG. 8 is a circuit diagram showing another configuration example of a temperature detection circuit.

In the first preferred embodiment, the temperature detection circuit 40 may have the configuration shown in FIG. 8. FIG. 8 is a circuit diagram showing another configuration of the temperature detection circuit 40. The temperature detection circuit 40 preferably includes a transistor M40, a constant current source 48, a band gap reference circuit 46, and resistors R44 and R45. The transistor M40 is preferably an N-channel MOSFET, its source is grounded, and the potential is fixed. The constant current source 48 as a constant current load is connected to the drain of the transistor M40. The band gap reference circuit 46 generates a constant voltage Vref. The resistors R44 and R45 divide the constant voltage Vref and apply the resultant voltage to the gate of the transistor M40. The temperature detection circuit 40 determines the low temperature state in accordance with the on/off state of the transistor M40.

A gate-source threshold voltage Vt of the MOSFET increases as the temperature decreases. Consequently, by preliminarily applying the constant voltage according to the threshold temperature for determining the low temperature state to the gate, the MOSFET turns off at low temperature and on at high temperature. Therefore, the low temperature state can be determined.

The temperature detection circuit 40 may include a temperature sensor for monitoring the temperature of the semiconductor laser LD1 to be driven. By directly monitoring the temperature of the semiconductor laser LD1 by the temperature sensor and controlling the value of the specified current Ilim in the current limiter 20, circuit protection can be realized.

The driving circuit 100 may be integrated or part of the driving circuit 100 may be constructed by a discrete component or a chip component. The part of integration or the degree of integration may be determined according to the specifications, cost, occupation area, and the like of the driving circuit 100.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A driving circuit for driving a semiconductor laser, comprising:
   a current output portion which outputs an output current according to an input and a control signal;
   an output amplifier arranged to amplify the output current of the current output portion and to supply the amplified current as a drive current to the semiconductor laser; and
   a temperature detection circuit arranged to detect an operation voltage of the semiconductor laser and to output the control signal to the current output portion according to a result of the comparison between the operation voltage and a predetermined threshold voltage; wherein
   the current output portion lowers the output current to a predetermined value in response to the control signal if the operation voltage is higher than the threshold voltage.

2. The driving circuit according to claim 1, wherein the current output portion includes:
   a voltage current converter arranged to convert the input voltage, which is determined according to a desired light brightness of the semiconductor laser, into a current; and
   a current limiter arranged to limit the output current of the voltage current converter to a specified current value or less.

3. The driving circuit according to claim 1, wherein the temperature detection circuit includes a comparator arranged to compare an operation voltage of the semiconductor laser with the predetermined threshold voltage.

4. The driving circuit according to claim 1, wherein the temperature detection circuit decreases the output current of the current output portion as the operation voltage of the semiconductor laser increases.

5. The driving circuit according to claim 4, wherein the temperature detection circuit includes an inverting amplifier arranged to amplify the difference between the operation voltage of the semiconductor laser and a predetermined reference voltage and, on the basis of an output voltage of the inverting amplifier, decreases the output current of the current output portion.

6. The driving circuit according to claim 1, wherein the temperature detection circuit includes:
   a transistor having a first end at which a potential is fixed and a second end to which a constant current load is connected; and
   a bias circuit arranged to apply a constant voltage to the gate of the transistor; wherein
   the temperature detection circuit determines when to decrease the output current of the current output portion in accordance with an on/off state of the transistor.

7. The driving circuit according to claim 1, wherein the temperature detection circuit includes a temperature sensor arranged to monitor a temperature of the semiconductor laser to be driven.

8. The driving circuit according to claim 2, wherein the voltage current converter includes:
   a first resistor having a first end at which a potential is fixed and a second end;
   a first transistor having one end that is connected to the second end of the first resistor;
   a second resistor having a first end at which a potential is fixed and a second end;
   a second transistor having one end that is connected to the second end of the second resistor; and
   a first operational amplifier including:
      a non-inversion input terminal to which a voltage according to the input voltage is applied and which is connected to a connection point of the first resistor and the first transistor; and
      an output terminal which is connected to control terminals of the first and second transistors and which outputs current flowing to the second transistor;
   wherein
   the current limiter includes:
      a third resistor having a first end at which a potential is fixed and a second end;

a third transistor having one end connected to the second end of the third resistor; and a second operational amplifier including:

a non-inversion input terminal to which a voltage according to the specified current value is applied and which is connected to a connection point of the third resistor and the third transistor; and an output terminal which is connected to control terminals of the first, second, and third transistors.

9. The driving circuit according to claim 1, wherein the driving circuit is integrated on a single semiconductor substrate.

10. A light emitting device comprising:
a semiconductor laser; and
the driving circuit according to claim 1 arranged to drive the semiconductor laser.

11. The light emitting device according to claim 10, wherein the semiconductor laser is a nitride semiconductor laser.

12. A disk drive comprising the light emitting device according to claim 10 arranged to irradiate a disk medium with light output from the semiconductor laser.

* * * * *